United States Patent
Ansari et al.

(10) Patent No.: US 6,867,645 B1
(45) Date of Patent: Mar. 15, 2005

(54) METHOD AND APPARATUS FOR PROVIDING PULSE WIDTH MODULATION

(75) Inventors: Zahid Ansari, Menlo Park, CA (US); Bruce L. Prickett, Fremont, CA (US); Jonathan Andrew Guy, Austin, TX (US)

(73) Assignee: Daydreams LLC, West Palm Beach, FL (US)

( * ) Notice: Subject to any disclaimer, the term of this patent is extended or adjusted under 35 U.S.C. 154(b) by 0 days.

(21) Appl. No.: 09/937,680

(22) PCT Filed: Mar. 28, 2000

(86) PCT No.: PCT/US00/08562
§ 371 (c)(1),
(2), (4) Date: Nov. 29, 2001

(87) PCT Pub. No.: WO00/59114
PCT Pub. Date: Oct. 5, 2000

Related U.S. Application Data (60) Provisional application No. 60/164,326, filed on Nov. 7, 1999, provisional application No. 60/163,707, filed on Nov. 5, 1999, provisional application No. 60/164,083, filed on Nov. 5, 1999, and provisional application No. 60/126,770, filed on Mar. 29, 1999.

(51) Int. Cl.$^7$ .............................................. H02M 7/162
(52) U.S. Cl. ......................... 327/588; 327/423; 363/132
(58) Field of Search ............................... 327/587–588, 327/423, 494, 110; 363/132–133; 332/109

(56) References Cited

U.S. PATENT DOCUMENTS

| | | | |
|---|---|---|---|
| 4,325,112 A | * 4/1982 | Otsuka ........................ | 363/42 |
| 5,021,936 A | * 6/1991 | Nishizawa et al. ........... | 363/41 |
| 5,373,195 A | 12/1994 | De Doncker et al. ......... | 307/45 |
| 5,589,805 A | 12/1996 | Zuraski et al. ............... | 322/109 |
| 5,710,699 A | 1/1998 | King et al. ................... | 363/132 |
| 5,767,740 A | 6/1998 | Fogg ............................ | 310/10 |
| 6,005,316 A | 12/1999 | Harris ........................ | 310/90.5 |
| 6,031,738 A | 2/2000 | Lipo et al. .................... | 363/37 |

\* cited by examiner

*Primary Examiner*—Quan Tra
(74) *Attorney, Agent, or Firm*—Winston & Strawn LLP (57) ABSTRACT

A pulse width modulation scheme allows the creation of a unipolar pulse width modulated output signal. Two switching circuits (104, 204), preferably different legs of an inverter circuit, can operate to not only modulate an input voltage but also to reverse the polarity of the PWM output signal. Both switching circuits can be configured to accomplish both features, thus the switching load is spread out across all four switches.

8 Claims, 7 Drawing Sheets

METHOD AND APPARATUS FOR PROVIDING PULSE WIDTH MODULATION

CROSS-REFERENCES TO RELATED APPLICATIONS

This patent claims the benefit of U.S. Provisional Applications 60/126,770 filed on Mar. 29, 1999, 60/164,083 filed Nov. 5, 1999, 60/163,707 filed Nov. 5, 1999, 60/164,326 filed Nov. 7, 1999.

BACKGROUND OF THE INVENTION

This invention relates generally to power supply circuits. More particularly, this invention relates to unipolar pulse width modulated power supply circuits.

Pulse width modulation is a technique that is utilized to power a variety of loads, including induction motor loads, lighting loads, etc. For example, with respect to induction motor loads, variable speed drives now exist that allow for the control of these induction motors. The variable speed drives (VSD's) allow the induction motors to be operated at a variety of different speeds. Furthermore, the speed of the induction motors can be monitored and the VSD output can be corrected via feedback from the sensed motor characteristic. Thus, an induction motor which previously operated at only a few set speeds, can now be operated throughout a spectrum of different speeds, particularly very low speeds.

Pulse Width Modulation (PWM) is a general technique in which a DC signal is pulsed out to a load. The magnitude of each DC pulse remains generally constant from pulse to pulse; however, the width of pulses will typically vary. In one PWM technique, for example, the pulse widths and pulse spacings are arranged so that their weighted average approaches a sine wave. This sine wave is considered to have a "fundamental" frequency, whereas the frequency of the pulses is referred to as the "carrier frequency." A variety of methods for generating a pulse width modulated signal can be seen in "A Centroid-Based PWM Switching Technique for Full-Bridge Inverter Applications" by Ali Yazdian-Varjani et al., in IEEE Transactions on Power Electronics, Vol. 13, No. 1, January 1998.

Figure 5:
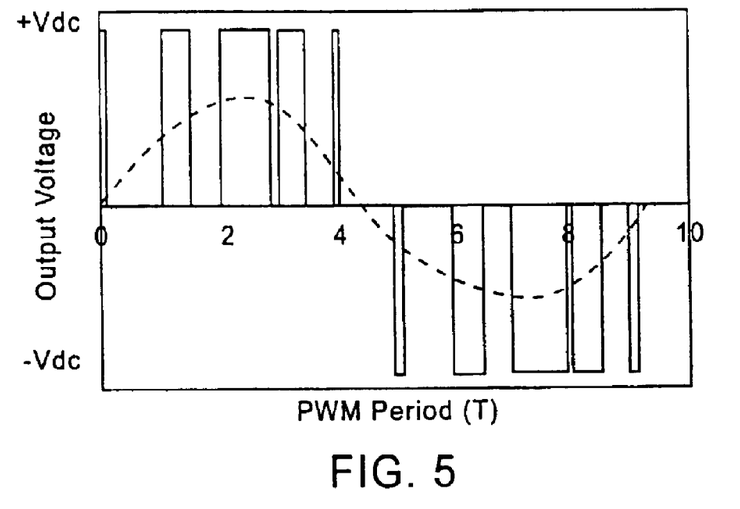
FIG. 5 shows a portion of a pulse width modulation output signal with a superimposed equivalent sine wave that corresponds to the PWM output signal.
Figure 6:
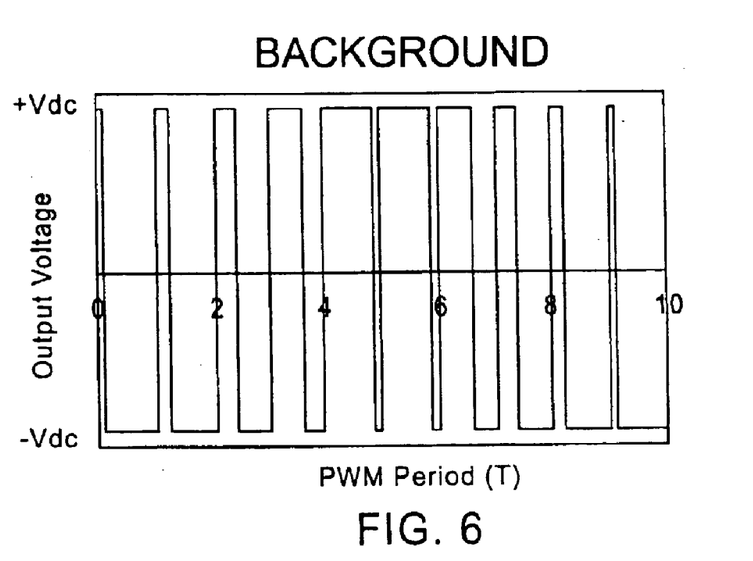
FIG. 6 shows a conventional bipolar pulse width modulation output signal.

At least two different types of pulse width modulation are in use. The more common is bipolar pulse width modulation. In bipolar pulse width modulation a waveform such as that shown in FIG. 6 is generated. As can be seen in FIG. 6, the PWM waveform extends between −Vdc and +Vdc during each transition. A second type of PWM is known as unipolar pulse width modulation. In unipolar pulse width modulation, a waveform such as that shown in FIG. 5 is produced. As can be seen in FIG. 5, the unipolar PWM waveform transitions between the reference voltage, e.g., zero volts, and +Vdc or −Vdc, depending upon the polarity of the output signal.

Figure 7:
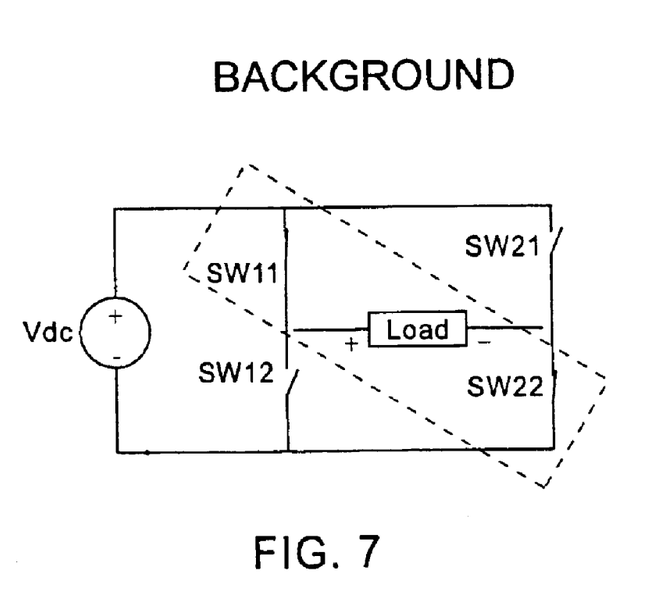
FIG. 7 shows a circuit configuration used to produce the output signal shown in FIG. 6, wherein a set of switches that operates as a conducting pair and as a non-conducting pair is shown within a dashed border.
Figure 8:
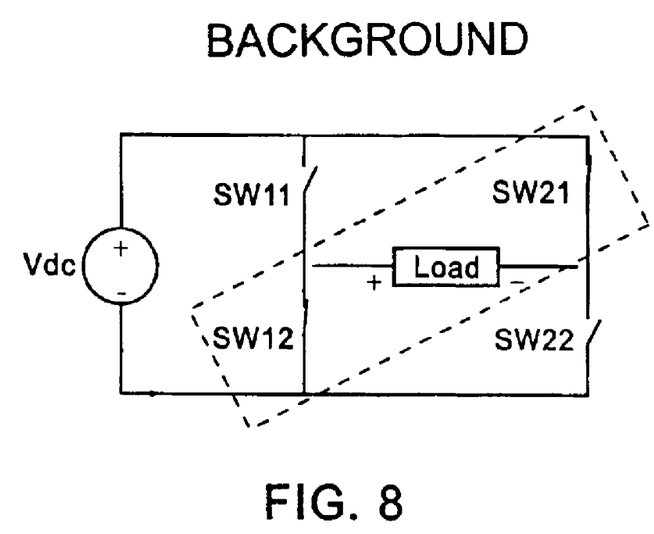
FIG. 8 shows a configuration of the circuit in FIG. 7 wherein the remaining set of switches that operates as a conducting pair and as a non-conducting pair is shown within a dashed border.

To generate the bipolar pulse width modulation signal a circuit such as that shown in FIGS. 7 and 8 is utilized. As can be seen in FIG. 7, an H-bridge inverter circuit is configured such that switches SW11 and SW22 are placed in a conducting position while switches SW12 and SW21 are placed in non-conducting position. This establishes a positive voltage across the load. Then, switches SW11 and SW22 are opened and switches SW12 and SW21 are closed, as shown in FIG. 8. Thus, four switch transitions are required to accomplish a transition of the PWM waveform.

Bipolar pulse width modulation waveforms have several drawbacks. The large magnitude of the transition, e.g., 2 Vdc, results in a large voltage overshoot. As a result, the load can be damaged by this large voltage overshoot. Furthermore, one must switch all of the switches to accomplish a single transition of the PWM waveform. In addition, current spikes and associated electromagnetic interference (emi) can result. Thus, bipolar pulse width modulated signals are less preferable than unipolar pulse width modulated waveforms.

In the Yazdian-Varjani, et al. article, the authors outlined an algorithm for generating a unipolar pulse width modulated waveform. Namely, it required using a first set of switches in the H-bridge inverter to control the polarity of the output waveform while utilizing a second set of switches to control the modulation of the DC signal, e.g., the width and spacing of pulses. Thus, the switches responsible for controlling the width and spacings of each pulse incurred much more switching than the two switches responsible for controlling the polarity of the signal applied to the load. This method still has several disadvantages due to the mismatch of the characteristics of switches.

Hence there is still a need for a pulse width modulation scheme that overcomes some of the disadvantages inherent to bipolar PWM as well as some of the drawbacks inherent to existing unipolar PWM schemes. Furthermore, there is simply a need for an additional scheme for generating a unipolar PWM output signal.

SUMMARY OF THE INVENTION

The present invention overcomes disadvantages of earlier PWM designs and provides inventive subject matter which satisfies needs left unfulfilled by the current state of the art.

One embodiment of the invention is advantageous in that it provides a pulse width modulation scheme that reduces the number of switching transitions required to accomplish a transition of the pulse width modulation output waveform.

Another advantage, is that one embodiment of the invention allows unipolar pulse width modulation to be accomplished while spreading the wear and tear of the switching transitions to all four switches in an inverter bridge.

Yet another embodiment of the invention is advantageous in that it provides a pulse width modulation scheme in which a switching circuit is operable to not only reverse the polarity of the pulse width modulation output waveform but also to produce the pulse width modulation waveform.

Similarly, an embodiment of the invention provides the advantage of using two switching circuits, wherein each is separately operable to produce a pulse width modulated waveform.

In accordance with one embodiment of the invention, a power supply system is provided comprising an input to receive a DC voltage signal, e.g., from a DC voltage source, a first switching circuit operable to modulate the DC voltage signal in order to produce a positive pulse width modulated voltage signal for about half the fundamental output period, and a second switching circuit configured to modulate the DC voltage signal for about the other half of the fundamental period. Each switching circuit may also be operable to reverse the polarity of the DC voltage signal so as to reverse the polarity of the pulse width modulated output signal. An output configured between the two switching circuits can be used to provide the output signal to a load.

Another embodiment of the invention provides a system with an input to receive a DC voltage signal, first and second switching circuits electrically coupled to the input, wherein the first switching circuit is operable to produce a positive pulse width modulated output signal as well as operable to reverse the polarity of the DC voltage signal applied to a load during operation. The second switching circuit may be used in a similar fashion so as to reverse polarity at the output and to provide a negative PWM signal at the output.

Other and further advantages and features of the invention will be apparent to those skilled in the art from a consideration of the following description taken in conjunction with the accompanying drawings wherein certain methods and apparatuses for practicing the invention are ill ated. However, it is to be understood that the invention is not limited to the details disclosed but includes all such variations and modifications as fall within the spirit of the invention and the scope of the appended claims.

DESCRIPTION OF THE SPECIFIC EMBODIMENTS

Figure 1:
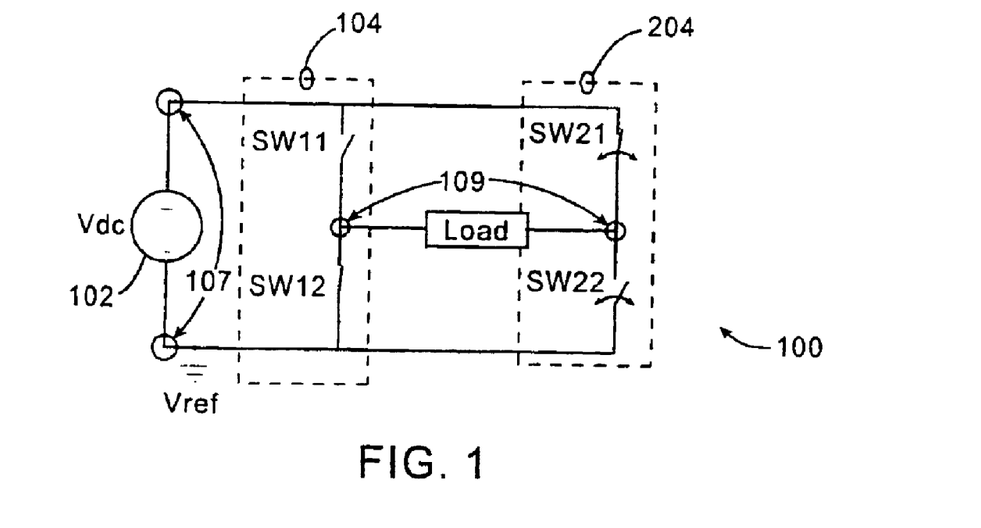
FIG. 1 shows a circuit in which a switching circuit modulates an input signal to determine pulse width and spacing of pulses while a second switching circuit controls the polarity of the output signal.

Referring now to FIG. 1, an embodiment of the invention can be seen as circuit 100. An inverter circuit is shown having four switches (SW11, SW12, SW21, and SW22). A power supply 102 provides an input voltage to the inverter through an input 107. In addition, an output is established between the switches of the inverters to electrically couple an output signal to the load.

The inverter circuit is preferably an H-bridge inverter circuit comprised of power transistors, such as MOSFET's. Alternatively, other power switching devices could be utilized as well. For example for motor loads of several hundred horsepower, IGBT's may be used or GTO's could be used for motors of several thousand horsepower. The inverter is preferably comprised of two switching circuits. A second switching circuit 204 is comprised of a first switch (SW21) and a second switch (SW22) electrically connected in series. Similarly, a first switching circuit of the inverter circuit is comprised of a first switch (SW11) and a second switch (SW12) electrically connected in series. Preferably, these two switching circuits are connected in parallel. Also, it is preferred that the two switching circuits be electrically coupled in parallel with an input 107 which is shown connected in parallel with the DC voltage source. An output port 108 is preferably established between the two switching circuits 104 and 204. One of the terminals of the input can be grounded so as to establish a reference voltage (Vref) of zero volts. Nevertheless, an offset could also be introduced into the circuit to produce a biased pulse width modulated (PWM) output signal.

Preferably, the input voltage source 102 is a DC voltage source that produces a DC voltage signal for manipulation by the H-bridge inverter circuit. While the phrase DC voltage is used throughout the specification and claims, it should be understood that a pure DC voltage is not required. As those of ordinary skill in the art would understand, practical circuits introduce a ripple into a voltage. So, those voltage signals are intended to be included under the definition of a DC voltage, as well.

Figure 2:
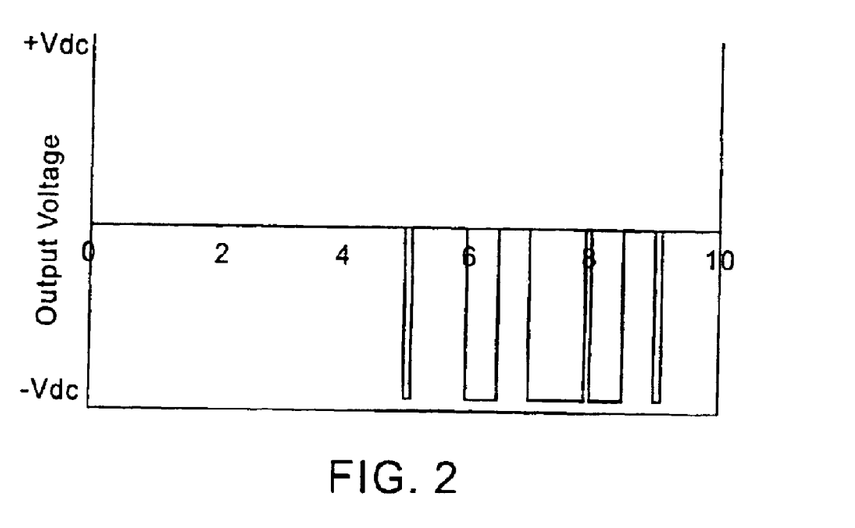
FIG. 2 shows the output signal produced by the circuit in FIG. 1.

The circuit of FIG. 1 is utilized to produce the output waveform shown in FIG. 2. Often, this waveform is referred to as a partial unipolar pulse width modulated waveform. FIG. 2 shows a series of pulses of varying width, but of common voltage magnitude, namely −Vdc. The polarity of the signal in FIG. 2, i.e., negative Vdc instead of positive Vdc, is determined by the configuration of the first switching circuit 104. Switch SW12 is shown in a conducting state; thus, it provides a path for a negative DC voltage signal to be applied to the load. The DC voltage signal output across the load will necessarily be −Vdc or zero volts in this configuration. Thus, switches SW11 and SW12 control the polarity when maintained in opposite conducting and non-conducting states. Thus, in the circuit of FIG. 1, the switching circuit 204 actually reverses the voltage of the input voltage +Vdc so that a negative PWM output voltage signal is created, oscillating between −Vdc and 0 volts.

Switching circuit 204 in FIG. 1 determines the pulse width and pulse intervals, that is to say, it modulates the input signal to produce the output waveform. FIG. 1 shows switches SW21 and SW22 with double headed arrows. This is to indicate that these switches oscillate between conducting and non-conducting states. Preferably, the two switches are not in conducting states simultaneously. Also, it is preferred that when one of these switches is switched from its conducting state to its non-conducting state that the other switch enter its conducting state from its non-conducting state. Thus, it is preferred to keep these switches in opposite states of conduction when modulating the DC signal.

The width and spacing of the PWM output signal pulses are determined by one of the various PWM schemes. Examples of such schemes are shown, for example, in: "Power Electronics" by Mohan, Undeland, and Robbins, Second Edition, John Wiley and Sons, Inc., 1995, which is hereby incorporated by reference for all that it discloses and for all purposes; "A Centroid-Based PWM Switching Technique for Full-Bridge Inverter Applications" by Ali Yazdian-Varjani et al., in IEEE Transactions on Power Electronics, Vol. 13 No. 1, January 1998, which is hereby incorporated by reference for all that it discloses and for all purposes; "electrical Machines, Drives, and Power Systems, Fourth Edition," by Theodore Wildi, Prentice Hall, 2000, which is hereby incorporated by reference for all that it discloses and for all purposes. In addition, U.S. Provisional Applications 60/126,770 filed on Mar. 29, 1999, 60/164,083 filed Nov. 5, 1999, 60/163,707 filed Nov. 5, 1999, 60/164,326 filed Nov. 7, 1999 are hereby incorporated by reference in their entirety for all that they disclose and for all purposes. These schemes would be readily understood by one of ordinary skill in the art. Thus, depending on the PWM scheme selected, control signals can be generated and transmitted by a processor to the inverter bridge circuit to control the timing of the operation of the switches. Thus, the opening and closing of switches SW21 and SW22 in FIG. 1 produces the pulses and pulse spacing in FIG. 2. Namely, switch SW22 is placed in the conducting state and switch SW21 is placed in a non-conducting state when a zero voltage is needed. Alternatively, switch SW22 is placed in a non-conducting state and switch SW21 is placed in a conducting state when a negative voltage is required to be output.

Figure 3:
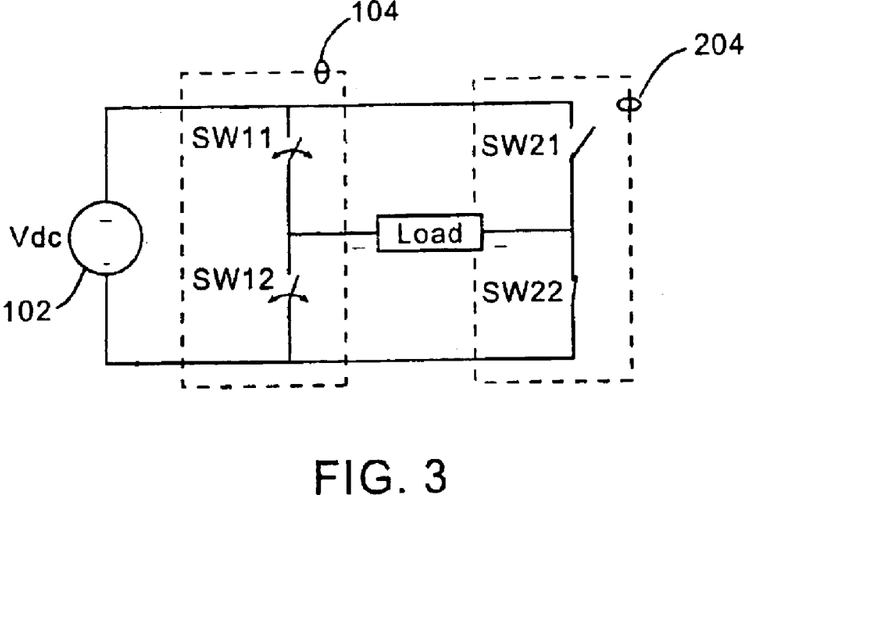
FIG. 3 shows the configuration of the circuit in FIG. 1 in which the second switching circuit controls the polarity of the output signal while the first switching circuit modulates the input signal to determine pulse width and spacing of pulses.

FIG. 3 shows the circuit of FIG. 1 configured to produce a positive portion of the unipolar PWM output voltage signal. In FIG. 3, switching circuit 204 is placed in the static arrangement where switch SW22 is maintained in a conducting state while switch SW21 is maintained in a non-conducting state. Thus switching circuit 204 is operable to control the polarity of the output signal.

Figure 4:
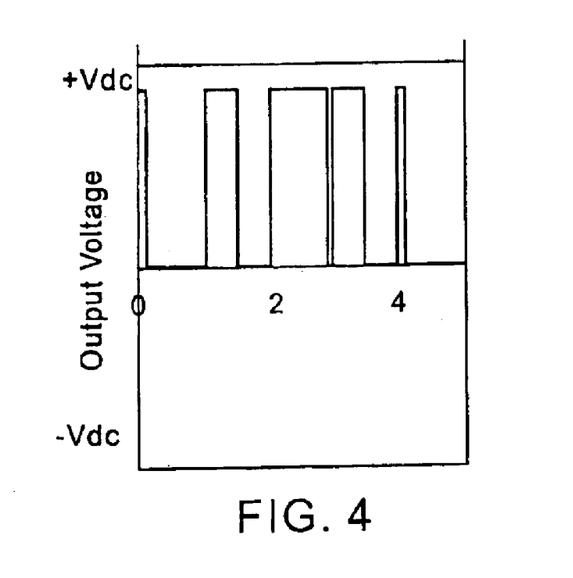
FIG. 4 shows the output signal produced by the circuit in FIG. 3.

In FIG. 3, switching circuit 104 is operable to modulate the input voltage Vdc so as to control the pulse width and pulse spacing of the output voltage pulses. Switches SW11 and SW12 operate in the same fashion as switches SW21 and SW22 operated to produce the negative PWM output waveform. Thus, as can be seen in FIG. 4, a positive portion of the unipolar PWM waveform is generated by the circuit shown in LEI FIG. 3.

By combining the switch arrangements of FIG. 1 and FIG. 3, a unipolar pulse width modulated output waveform is generated, as illustrated in FIG. 5. FIG. 5 also shows a sine wave having a fundamental period (T). This sine wave represents the equivalent sine wave that, in the case of an induction motor load, would cause the induction motor to run at the same speed as that caused by the unipolar pulse width modulated waveform of FIG. 5. While the frequency of this equivalent waveform, i.e., the sine wave, is referred to as the fundamental frequency, the frequency of the PWM waveform is referred to as the carrier frequency. Thus, the circuit of FIG. 1 is utilized to produce a negative portion of the unipolar pulse width modulated waveform relative to the reference voltage for approximately one half of the fundamental period. Similarly, the circuit of FIG. 3 is utilized to produce the positive portion of the unipolar pulse width modulated waveform relative to the reference voltage for approximately the other half of the fundamental period. The switching arrangement can be repeated indefinitely for additional periods FIG. 6 illustrates the output voltage produced by conventional systems known as bipolar pulse width modulated voltage signal. As can be seen, the transition of this type of waveform results in a transition of 2 Vdc. Thus, as those of ordinary skill in the art would appreciate, the voltage overshoot is twice the magnitude of the transition, namely 4 Vdc. In contrast, the unipolar PWM scheme outlined above, would only produce a transition of Vdc and an associated overshoot of 2 Vdc across the switch. Thus, the unipolar scheme is much less damaging to the components of the load, because less voltage is placed across it.

FIGS. 7 and 8 highlight the association of switches used in the conventional bipolar PWM scheme. As can be seen in FIG. 7 and FIG. 8, switches SW11 and SW22 operate in unison, while switches SW12 and SW21 also operate in unison. Thus, when SW11 and SW22 are in a conducting state and SW12 and SW21 are in a non-conducting state, a voltage of +Vdc is applied across the load. Similarly, when SW12 and SW21 are in a conducting state and SW11 and SW22 are in a non-conducting state, as shown in FIG. 8, then a voltage of −Vdc is applied across the load. Consequently, in order for a transition of the PWM output signal to occur, all four switches must change state. This creates heat, electrical noise, and shortens the life span of the switches. In contrast, the circuits of FIGS. 1 and 3 generally only require a transition of two switches in order to cause a transition of the output signal (although 4 additional switch transitions could be required each cycle to account for the two polarity changes each cycle). Thus, the disclosed unipolar PWM switching scheme is accomplished with fewer switch transitions than that required to produce a bipolar pulse width modulated output voltage.

Similarly, in contrast to the unipolar PWM scheme disclosed by Yazdian-Varjani et al., as referenced above, the present unipolar PWM scheme spreads the switching evenly across the four switches of the inverter. In the method of Yazdian-Varjani et al., a single switching circuit was responsible for modulating the DC input signal, while the other switching circuit was solely responsible for controlling the polarity of the output PWM signal. The PWM scheme disclosed herein distributes those responsibilities to both switching circuits. Thus, each switching circuit can be operated to control polarity as well as to modulate the DC voltage signal. Thus, it is advantageous in that it spreads the switching load across all of the switches (SW11, SW12, SW21, and SW22). It also provides symmetry of the two half-bridges. Thus, timing of transitions is simplified because response time of the switches would be similar, as opposed to the system of Yazdian-Varjani et al. in which different switches were proposed for the different half bridges.

The preferred embodiment of the invention has been described with the high side switches (i.e., switches SW11 and SW21 which are electrically coupled to the high side of the power supply) operated so as not to be in a conducting state for a half-cycle of the fundamental output frequency. Rather, as noted in FIG. 1 and FIG. 3, the low side switches (SW12 and SW22) are used to control the polarity by remaining on for approximately one half of the fundamental output period. This is yet another advantage over the scheme proposed by Yazdian-Varjani et al. because it typically requires less complicated circuitry to keep the low side switches in a conducting state as compared to the high side switches. For example, a lower cost "boot strap supply" can be used for the high side FET gate drivers in this preferred embodiment. Nevertheless, it should be understood that one might choose to reverse the conduction states of switches SW11 and SW12 in FIG. 1 and SW21 and SW22 in FIG. 3. Thus, such an alternative embodiment would also be covered by this invention.

Figure 9:
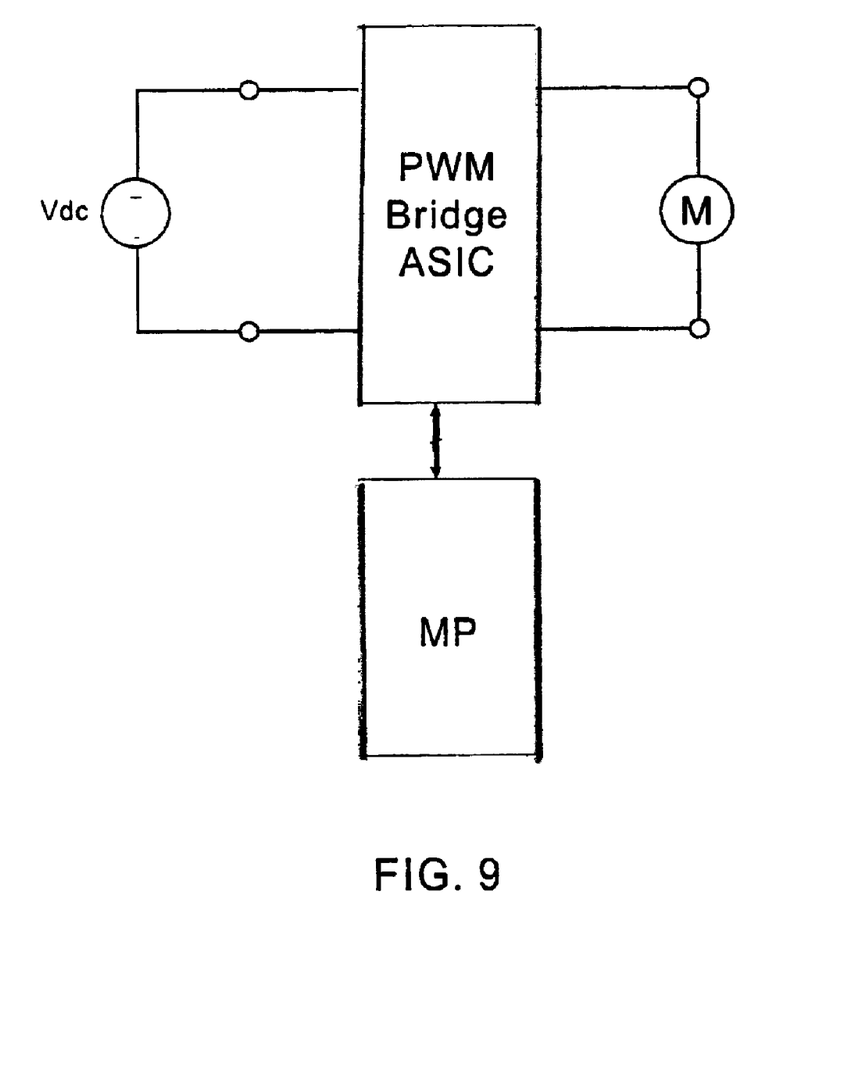
FIG. 9 shows an embodiment in which a processor provides control signals to an application specific integrated circuit bridge to produce a pulse width modulated output signal that powers a motor.

FIG. 9 shows an embodiment in which the inverter bridge circuit is configured as part of an application specific integrated circuit, as would be understood by a person of ordinary skill in the art. The ASIC may either house just the power transistors, or it may be configured with a microprocessor so as to allow the control signals for the switches to be routed directly to the power transistors without any external wiring. In FIG. 9, a microprocessor is shown separate from the ASIC. Similarly, the ASIC could also include a power supply or power conversion circuit to produce the DC waveform utilized in creating a pulse width modulated output.

Figure 10:
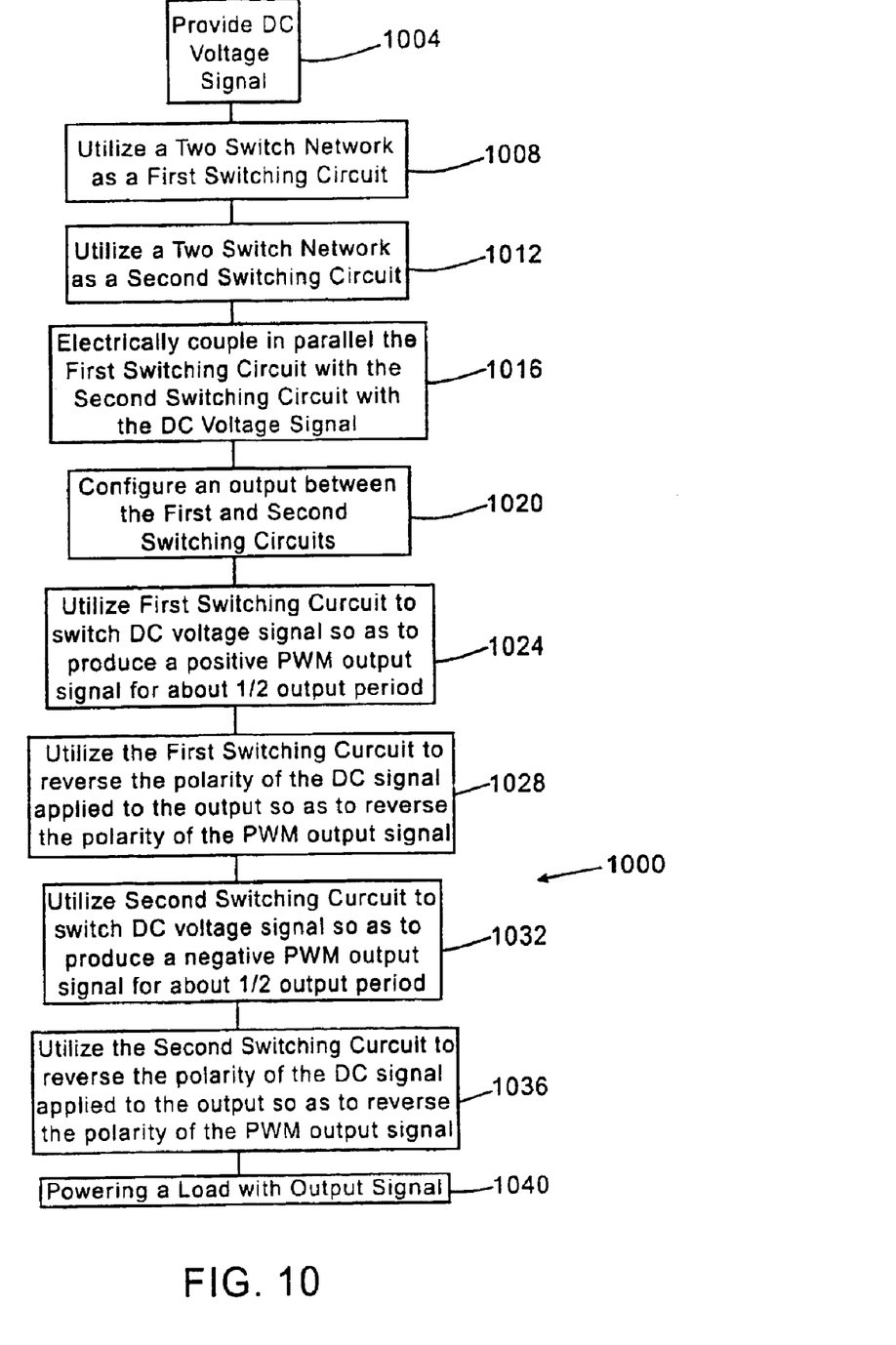
FIG. 10 shows a flow diagram that illustrates the method of operation of producing a pulse width modulated output voltage.

FIG. 10 illustrates a method 1000 for implementing an embodiment of the invention. As shown in FIG. 10, a DC voltage signal is provided 1004. One may utilize a two switch network as a first switching circuit 1008 and utilize a two switch network as a second switching circuit 1012. The switching circuits are preferably electrically coupled in parallel with the DC voltage signal 1016. Also, an output is configured between the first and second switching circuits 1020. The first switching circuit is utilized to modulate the DC voltage signal so as to produce a positive PWM output signal for about one, half of the fundamental output period 1024. In addition, the first switching circuit is utilized to reverse the polarity of the DC signal applied to the output so as to reverse the polarity of the PWM output signal 1028. Similarly, the second switching circuit is utilized to switch the DC voltage signal so as to produce a negative PWM output signal for the other half of the fundamental output period 1032. Also, the second switching circuit is utilized to reverse the polarity of the DC signal applied to the output so as to reverse the polarity of the PWM output signal 1036. The load is powered with the generated output signal 1040.

In addition to embodiments where the invention is accomplished by hardware, it is also noted that these embodiments can be accomplished through the use of an article of manufacture comprised of a computer usable medium having a computer readable program code embodied therein, which causes the enablement of the functions disclosed in this description. For example, this might be accomplished through the use of hardware description language (HDL), register transfer language (Rn), VERILOG, VHDL or similar programming tools, as one of ordinary skill in the art would understand. It is therefore envisioned that the functions accomplished by the present invention as described above could be represented in a core which could be utilized in programming code and transformed to hardware as part of the production of integrated circuits. Therefore, it is desired that the embodiments expressed above also be considered protected by this patent in their program code means as well.

It is also noted that many of the structures and acts recited herein can be recited as means for performing a function or steps for performing a function, respectively. Therefore, it should be understood that such language is entitled to cover all such structures or acts disclosed within this specification and their equivalents, including the matter incorporated by reference.

It is thought that the apparatuses and methods of the embodiments of the present invention and many of its attendant advantages will be understood from the foregoing description. It will be apparent that various changes may be made in the form, construction and arrangement of the parts thereof without departing from the spirit and scope of the invention or sacrificing all of its material advantages, the form hereinbefore described being merely a preferred or exemplary embodiment thereof.

What is claimed is:

1. An apparatus to generate a pulse width modulated voltage signal, said apparatus comprising:

a DC voltage source;

a first switching circuit comprising a first switch and a second switch configured in a series circuit, said first switching circuit electrically coupled in parallel with said DC voltage source;

a second switching circuit comprising a third switch and a fourth switch configured in a series circuit, said second switching circuit electrically coupled in parallel with said DC voltage source;

an output comprising a first electrical junction coupling said first switch with said second switch and a second electrical junction coupling said third switch with said fourth switch;

said second switching circuit configured to maintain said third switch in a conduction state while said fourth switch is maintained in a non-conducting state so as to establish a first polarity of an output signal;

said first switching circuit configured to switch said first switch and said second switch at a modulation frequency;

said first switching circuit configured to maintain said second switch in a conducting state while maintaining said first switch in a non-conducting state so as to establish a second polarity of said output signal, said second polarity being the reverse polarity of said first polarity;

said second switching circuit configured to switch said third switch and said fourth switch at said modulation frequency; and a microprocessor electrically coupled to the first and second switching circuits, wherein the microprocessor generates control signals according to a selected pulse width modulation scheme to control the timing and operation of the first and second switching circuits.

2. The apparatus as described in claim 1 wherein said first switching circuit and said second switching circuit are configured as part of an application specific integrated circuit.

3. The apparatus as described in claim 1 wherein said first switching circuit is configured to produce a positive pulse width modulated output signal during about one half cycle of a fundamental output period; and wherein said second switching circuit is configured to produce a negative pulse width modulated output signal during the other half cycle of said fundamental output period.

4. The apparatus as described in claim 1 and further comprising a motor electrically coupled to said output.

5. A method of generating a pulse width modulated voltage signal, said method comprising:

providing a DC voltage source;

electrically coupling said DC voltage source in parallel with a first switching circuit comprising a first switch and a second switch configured in a series circuit;

electrically coupling said DC voltage source in parallel with a second switching circuit comprising a third switch and a fourth switch configured in a series circuit;

establishing an output comprising a first electrical junction coupling said first switch with said second switch and a second electrical junction coupling said third switch and said fourth switch;

generating control signals with a processor according to a selected pulse width modulation scheme to control the timing and operation of the first and second switching circuits;

maintaining said third switch in a conduction state while maintaining said fourth switch in a non-conducting state according to the control signals so as to establish a first polarity of an output signal;

switching said first switch and said second switch at a selected modulation frequency; then maintaining said second switch in a conducting state while maintaining said first switch in a non-conducting state according to the control signals so as to establish a second polarity of said output signal, said second polarity being the reverse polarity of said first polarity; and switching said third switch and said fourth switch at said selected modulation frequency.

6. The method as described in claim 5 and further comprising:

configuring said first switching circuit and said second switching circuit as part of an application specific integrated circuit.

7. The method as described in claim 5 and further comprising:

utilizing said first switching circuit to produce a positive pulse width modulated output signal during about one half cycle of a fundamental output period; and utilizing said second switching circuit to produce a negative pulse width modulated output signal during the other half cycle of said fundamental output period.

8. The method as described in claim 5 and further comprising powering a motor with said output signal.

* * * * *

UNITED STATES PATENT AND TRADEMARK OFFICE
CERTIFICATE OF CORRECTION

| | | |
|---|---|---|
| PATENT NO. | : 6,867,645 B1 | Page 1 of 5 |
| APPLICATION NO. | : 09/937680 | |
| DATED | : March 15, 2005 | |
| INVENTOR(S) | : Ansari et al. | |

It is certified that error appears in the above-identified patent and that said Letters Patent is hereby corrected as shown below:

The title page showing the illustrative figure should be deleted to be replaced with the attached title page.

The drawing sheets, (1, 2, and 6) consisting of Figs. 1, 2, 3, 4 and 9, should be deleted to be replaced with the drawing sheets, consisting of Figs. 1, 2, 3, 4 and 9, as shown on the attached pages.

Drawings:
On the title page and in FIG. 1, in the power supply 102, delete the upper "–" sign and insert -- + --.
On the title page and in FIG. 3, in the power supply 102, delete the upper "–" sign and insert -- + --; and to the left of the "LOAD" box, delete the "–" sign and insert -- + --.
FIG. 9, at the "Vdc" location, delete the upper "–" sign and insert -- + --.

Column 3:
Line 8, after "apparatuses for practicing the invention are" delete "ill ated." and insert -- illustrated. --
Line 61, after "The inverter circuit is preferably an" delete "II-bridge" and insert -- H-bridge --.

Column 4:
Line 10, after "port" delete "108" and insert -- 109 --.

Column 5:
Line 32, before "FIG. 3." delete "LEI".

Signed and Sealed this

Twenty Second Day of April, 2008

JON W. DUDAS
*Director of the United States Patent and Trademark Office*

(12) United States Patent
Ansari et al.

(10) Patent No.: US 6,867,645 B1
(45) Date of Patent: Mar. 15, 2005

(54) METHOD AND APPARATUS FOR PROVIDING PULSE WIDTH MODULATION

(75) Inventors: Zahid Ansari, Menlo Park, CA (US); Bruce L. Prickett, Fremont, CA (US); Jonathan Andrew Guy, Austin, TX (US)

(73) Assignee: Daydreams LLC, West Palm Beach, FL (US)

(*) Notice: Subject to any disclaimer, the term of this patent is extended or adjusted under 35 U.S.C. 154(b) by 0 days.

(21) Appl. No.: 09/937,680

(22) PCT Filed: Mar. 28, 2000

(86) PCT No.: PCT/US00/08562

§ 371 (c)(1),
(2), (4) Date: Nov. 29, 2001

(87) PCT Pub. No.: WO00/59114

PCT Pub. Date: Oct. 5, 2000

Related U.S. Application Data (60) Provisional application No. 60/164,326, filed on Nov. 7, 1999, provisional application No. 60/163,707, filed on Nov. 5, 1999, provisional application No. 60/164,083, filed on Nov. 5, 1999, and provisional application No. 60/126,770, filed on Mar. 29, 1999.

(51) Int. Cl.[7] ............................................. H02M 7/162
(52) U.S. Cl. ........................ 327/588; 327/423; 363/132
(58) Field of Search .............................. 327/587–588, 327/423, 494, 110; 363/132–133; 332/109

(56) References Cited

U.S. PATENT DOCUMENTS

| | | | |
|---|---|---|---|
| 4,325,112 A | * | 4/1982 | Otsuka ..................... 363/42 |
| 5,021,936 A | * | 6/1991 | Nishizawa et al. ........ 363/41 |
| 5,373,195 A | | 12/1994 | De Doncker et al. ..... 307/45 |
| 5,589,805 A | | 12/1996 | Zuraski et al. ............ 322/109 |
| 5,710,699 A | | 1/1998 | King et al. ................ 363/132 |
| 5,767,740 A | | 6/1998 | Fogg ......................... 310/10 |
| 6,005,316 A | | 12/1999 | Harris ....................... 310/90.5 |
| 6,031,738 A | | 2/2000 | Lipo et al. ................. 363/37 |

* cited by examiner

*Primary Examiner*—Quan Tra
(74) *Attorney, Agent, or Firm*—Winston & Strawn LLP (57) ABSTRACT

A pulse width modulation scheme allows the creation of a unipolar pulse width modulated output signal. Two switching circuits (104, 204), preferably different legs of an inverter circuit, can operate to not only modulate an input voltage but also to reverse the polarity of the PWM output signal. Both switching circuits can be configured to accomplish both features, thus the switching load is spread out across all four switches.

8 Claims, 7 Drawing Sheets